United States Patent
Su et al.

(10) Patent No.: US 11,688,651 B2
(45) Date of Patent: Jun. 27, 2023

(54) SEMICONDUCTOR STRUCTURE, MANUFACTURING METHOD THEREOF AND METHOD FOR DETECTING SHORT THEREOF

(71) Applicant: Winbond Electronics Corp., Taichung (TW)

(72) Inventors: Hung-Ming Su, Taichung (TW); Kazuaki Takesako, Kanagawa (JP); Chun-Chiao Tseng, Taichung (TW)

(73) Assignee: Winbond Electronics Corp., Taichung (TW)

( * ) Notice: Subject to any disclaimer, the term of this patent is extended or adjusted under 35 U.S.C. 154(b) by 265 days.

(21) Appl. No.: 16/808,410

(22) Filed: Mar. 4, 2020

(65) Prior Publication Data
US 2020/0286796 A1    Sep. 10, 2020

(30) Foreign Application Priority Data
Mar. 8, 2019   (TW) .................................. 108107928

(51) Int. Cl.
*H01L 21/66*      (2006.01)

(52) U.S. Cl.
CPC .............. *H01L 22/14* (2013.01); *H01L 22/32* (2013.01); *H01L 22/34* (2013.01)

(58) Field of Classification Search
None
See application file for complete search history.

(56) References Cited

U.S. PATENT DOCUMENTS

| 2004/0178811 | A1 | 9/2004 | Ishitani et al. |
| 2006/0172443 | A1 | 8/2006 | Ramappa |
| 2014/0127835 | A1* | 5/2014 | Wang .................. H01L 22/12 438/7 |
| 2017/0154687 | A1 | 6/2017 | Song et al. |

FOREIGN PATENT DOCUMENTS

| CN | 101930905 | | 12/2010 | |
| CN | 106531724 | * | 3/2017 | ........... H01L 23/544 |
| CN | 106847728 | | 6/2017 | |
| CN | 106876319 | | 6/2017 | |
| TW | 200428005 | | 12/2004 | |

OTHER PUBLICATIONS

"Office Action of China Counterpart Application", dated Aug. 11, 2021, p. 1-p. 9.

* cited by examiner

*Primary Examiner* — Alexander G Ghyka
(74) *Attorney, Agent, or Firm* — JCIPRNET

(57) ABSTRACT

Provided is a semiconductor structure including a substrate, at least two tested structures, an isolation structure, and a short-circuit detection structure. At least two tested structures are disposed on the substrate. The at least two tested structures include a conductive material. The isolation structure is sandwiched between at least two tested structures. The detection structure includes a detecting layer, and the detecting layer is disposed on one of the at least two tested structures, so that a short circuit defect between the at least two tested structures may be identified in an electron beam detecting process, and the detecting layer includes a conductive material. A manufacturing method of the semiconductor structure and a method for detecting a short circuit of the semiconductor structure are also provided.

13 Claims, 7 Drawing Sheets

SEMICONDUCTOR STRUCTURE, MANUFACTURING METHOD THEREOF AND METHOD FOR DETECTING SHORT THEREOF

CROSS-REFERENCE TO RELATED APPLICATION

This application claims the priority benefit of Taiwan application serial no. 108107928, filed on Mar. 8, 2019. The entirety of the above-mentioned patent application is hereby incorporated by reference herein and made a part of this specification.

BACKGROUND

Field of the Invention

The invention relates to a semiconductor structure with a detection structure, a manufacturing method of the semiconductor structure and a detecting method of the semiconductor structure, and the detection structure is configured to detect a short-circuit defect.

Description of Related Art

In order to enhance product yield rates, before mass production, the semiconductor industry designs various detection layouts for each device component of products, thereby detecting unexpected errors during a manufacturing process, and in this way, defects in the devices can be improved.

However, defect detection has limitation to a certain degree. For example, when a defect size is too small (for example, smaller than 30 nm), the detection cannot be performed in an optical manner. How to detect a small size defect will become an important subject.

SUMMARY

The invention provides a semiconductor structure, a manufacturing method of the semiconductor structure and a method for detecting a short-circuit of the semiconductor structure, which can detect the short-circuit defect so as to acquire whether there is any small size defect appearing in a manufacturing process.

The invention provides a semiconductor structure, including a substrate, at least two tested structures, an isolation structure and a short-circuit detection structure. The at least two tested structures are disposed on the substrate. A material of the at least two tested structures includes a conductive material. The isolation structure is sandwiched between the at least two tested structures. The short-circuit detection structure includes a detecting layer, and the detecting layer is disposed on any one of the at least two tested structures, such that the short-circuit defect between the at least two tested structures is identified in an electron beam detecting process, and a material of the detecting layer includes a conductive material.

The invention provides a manufacturing method of a semiconductor structure, which includes the following steps. A substrate is provided. At least two tested structures are formed on the substrate. An isolation structure is formed between the at least two tested structures. A short-circuit detection structure is formed on the at least two tested structures. The step of forming the short-circuit detection structure includes forming a detecting layer on one of the at least two tested structures.

The invention provides a method for detecting a short-circuit of the semiconductor structure as described above, which includes the following steps. The short-circuit detection structure is scanned by an electron beam. A change of a voltage contrast image of the short-circuit detection structure is detected after the short-circuit detection structure is scanned. When a surface of one of the at least two tested structures which is connected with the detecting layer shows a bright spot, and a surface of the other one of the at least two tested structures shows a dark spot, it indicates that the at least two tested structures are electrically insulated from each other. When the surfaces of the at least two tested structures both show bright spots, it indicates that the at least two tested structures are electrically connected with each other.

Based on the above, in the invention, the detecting layer is formed on one of the at least two tested structures, so as to overcome an issue that the electron beam detecting process cannot be used for the detection due to an equipotential phenomenon existing when the short-circuit defect is detected.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further beneath standing of the invention, and are incorporated in and constitute a part of this specification. The drawings illustrate embodiments of the invention and, together with the description, serve to explain the principles of the invention.

DESCRIPTION OF EMBODIMENTS

Figure 1A:
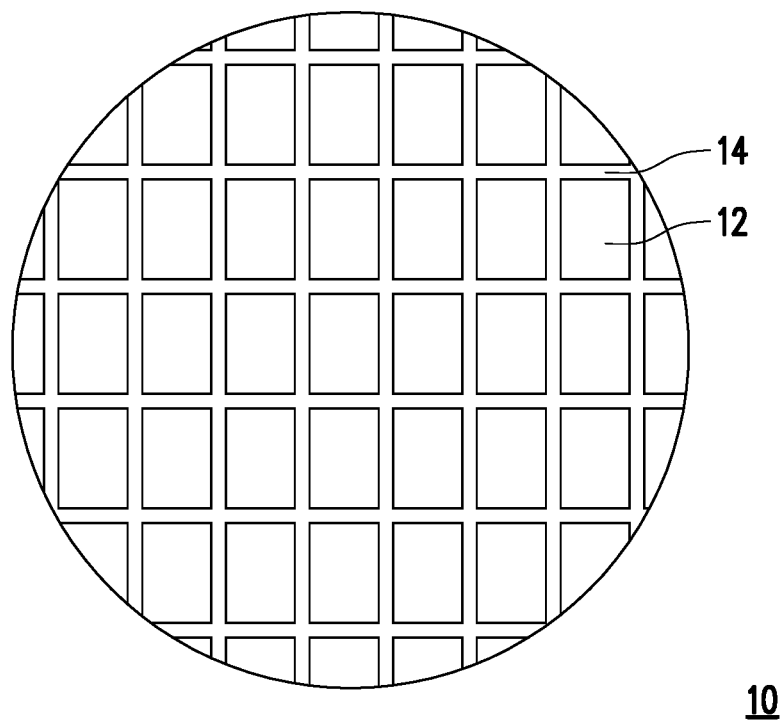
FIG. 1A is a schematic top view of a wafer according to an embodiment of the invention.

The invention will be described comprehensively with reference to drawings of the embodiments. However, the invention can be embodied in various forms and should not be limited in the embodiments of this specification. Layers and region thicknesses in the drawings will be exaggerated for clarity. The same or similar devices are represented by the same or similar symbols and will not be repeatedly described in the following paragraphs.

When a defect size is too small (for example, smaller than 30 nm), a detection is incapable of being performed in an optical manner. In the embodiments of the invention, an electron beam (e-beam) may be used to effectively detect a short-circuit defect by utilizing an equipotential phonomenon.

Referring to FIG. 1A, a semiconductor structure having a short-circuit detection structure is provided in the present embodiment. The semiconductor structure may be located in die regions 12 of a wafer 10. In some embodiments, the semiconductor structure may also be located on scribe lines 14 of the wafer 10 for performing detection by means of simulating internal devices of the wafer, and thus, the semiconductor structure having the short-circuit detection structure is removed together with the scribe lines 14 after the detection is completed, thereby reducing a probability that product performance is affected when the short-circuit detection structure is removed.

Figure 1B:
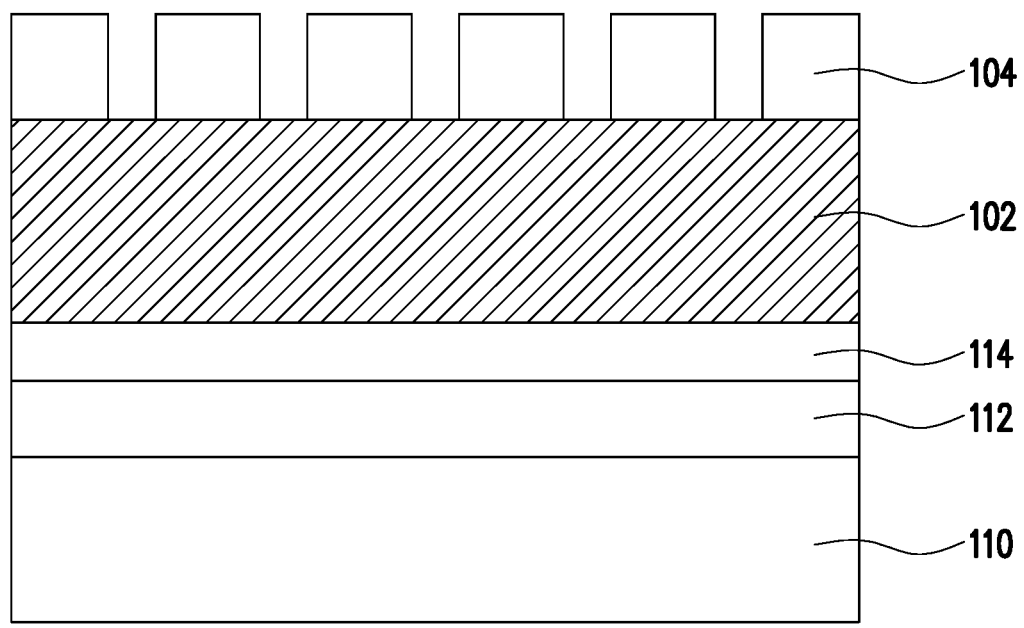
FIG. 1B through FIG. 1E are schematic cross-sectional views of a manufacturing process of a semiconductor structure according to an embodiment of the invention.

Referring to FIG. 1B, a manufacturing method of a semiconductor structure 100 is also provided in the present embodiment and include the following steps. First, a substrate 110 is provided. In the present embodiment, the substrate 110 is, for example, a silicon substrate.

Then, a first insulation layer 112 and a second insulation layer 114 are sequentially formed on the substrate 110. Materials of the first insulation layer 112 and the second insulation layer 114 includes, for example, silicon oxide, silicon nitride or a combination thereof. The materials of the first insulation layer 112 and the second insulation layer 114 may be the same or different.

The first insulation layer 112 may directly contact the substrate 110. The other insulation layers, semiconductor layers, conductive layers or a combination thereof may also be included between the first insulation layer 112 and the substrate 110. In the same way, the second insulation layer 114 may also directly contact the first insulation layer 112, and other insulation layers, semiconductor layers, conductive layers or a combination thereof may also be included between the second insulation layer 114 and the first insulation layer 112.

Then, a conductive material layer 102 and a mask layer 104 are formed on the second insulation layer 114. The conductive material layer 102 may include a single layer or multiple layers. A material of the mask layer 104 includes, for example, a patterned photoresist layer. The mask layer 104 includes a plurality of openings exposing the conductive material layer 102.

Figure 1C:
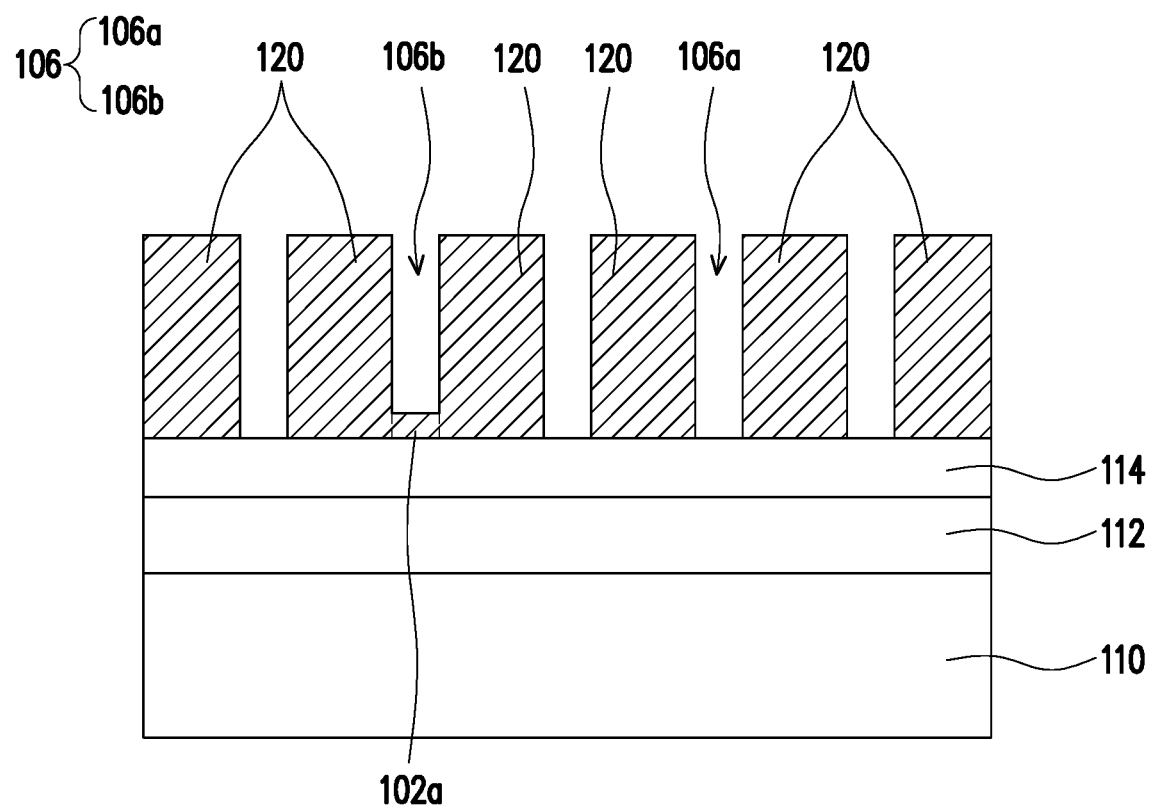

Referring to FIG. 1B and FIG. 1C simultaneously, an etching process is performed on the conductive material layer 102 with the mask layer 104 as an etching mask to remove the conductive material layer 102 exposed by the openings, so as to form a plurality of tested structures 120 and a plurality of openings 106. In the present embodiment, the tested structures 120 are, for example, contact windows, but the invention is not limited thereto.

Each of the openings 106 is between two tested structures 120. In some embodiments, the openings 106 are also referred to as trenches. According to a situation of the formation, the openings 106 may be classified into normal openings 106a and a defective opening 106b. The normal openings 106a are completely etched openings with the second insulation layer 114 exposed from bottoms thereof. The defective opening 106b is an incompletely etched opening with the conductive material layer 102a remaining on a bottom thereof, without exposing the second insulation layer 114.

In other words, each normal opening 106a is capable of separating two adjacent tested structures 120 from each other. The defective opening 106b is incapable of separating two adjacent tested structures 120 from each other. More specifically, the conductive material layer 102a remaining beneath the defective opening 106b causes two adjacent tested structures 120 to be electrically connected with each other.

Figure 1D:
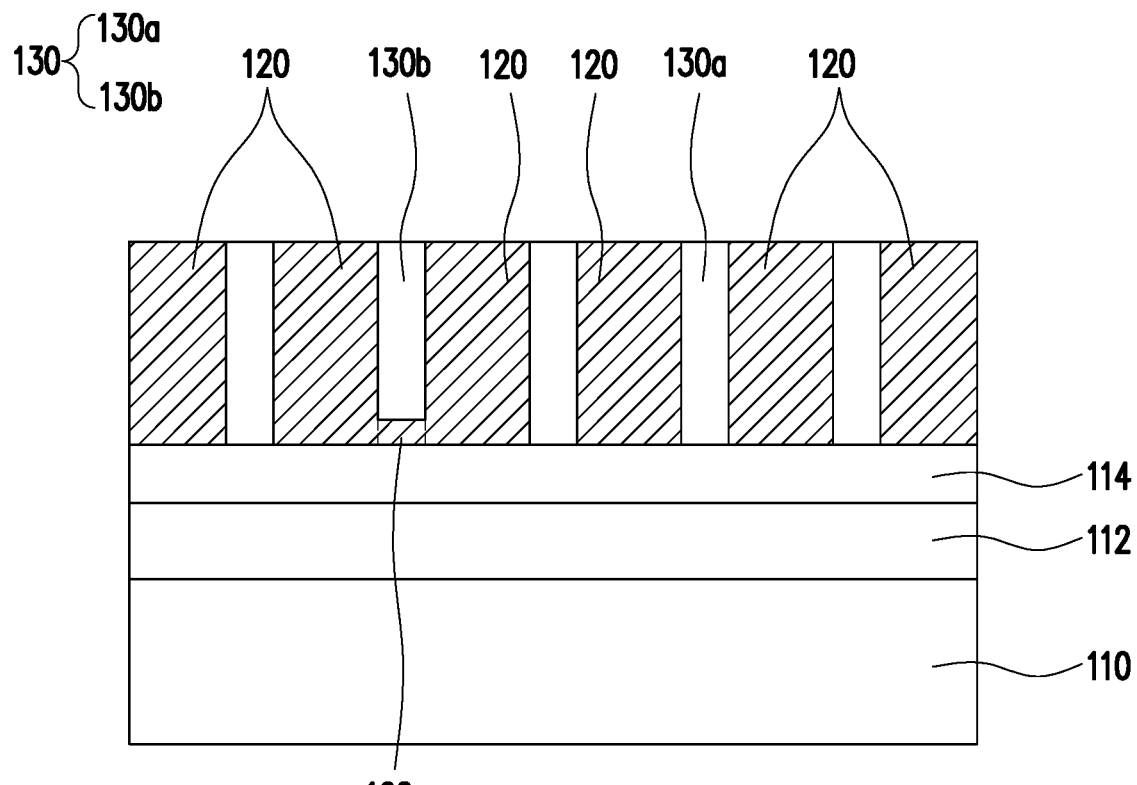

Then, referring to FIG. 1C and FIG. 1D, the mask layer 104 is removed, and isolation structures are formed in the openings 106. The isolation structures are, for example, dielectric layers 130. A material of the dielectric layers 130 includes, for example, silicon nitride, silicon oxide or a combination thereof. In some embodiments, a method of forming the dielectric layers 130 is described as follows. A dielectric material layer is formed on the tested structures 120 and in the openings 106a and 106b. Then, a removing process is performed to remove the dielectric material layer on the tested structures 120. The removing process may be a chemical mechanical polishing (CMP) process or a etching back process.

The dielectric layer 130 is sandwiched between at least two of the tested structures 120. The dielectric layers 130 formed in the normal openings 106a are referred to as normal dielectric layers 130a. Bottom surfaces of the normal dielectric layers 130a are coplanar with bottom surfaces of the tested structures 120. In this case, the bottom surfaces are those adjacent to the second insulation layer 114. The normal dielectric layer 130a may isolate at least two of the tested structures 120, such they are not conducted with each other. In other words, no short-circuit defect exists between the two tested structures 120.

On the other hand, the dielectric layer 130 formed in the defective opening 106b is referred to as a defective dielectric layer 130b. In some embodiments, in comparison with the bottom surfaces of the tested structures 120, a bottom surface of the defective dielectric layer 130b is relatively far away from a surface of the substrate 110. Namely, the bottom surface of the defective dielectric layer 130b is higher than the bottom surfaces of the tested structures 120. The defective dielectric layer 130b is incapable of isolating at least two of the tested structures 120. The at least two tested structures 120 are conducted with each other through the conductive material layer 102a remaining beneath the defective dielectric layer 130b. In other words, a short-circuit defect exists between the two tested structures 120.

Figure 1E:
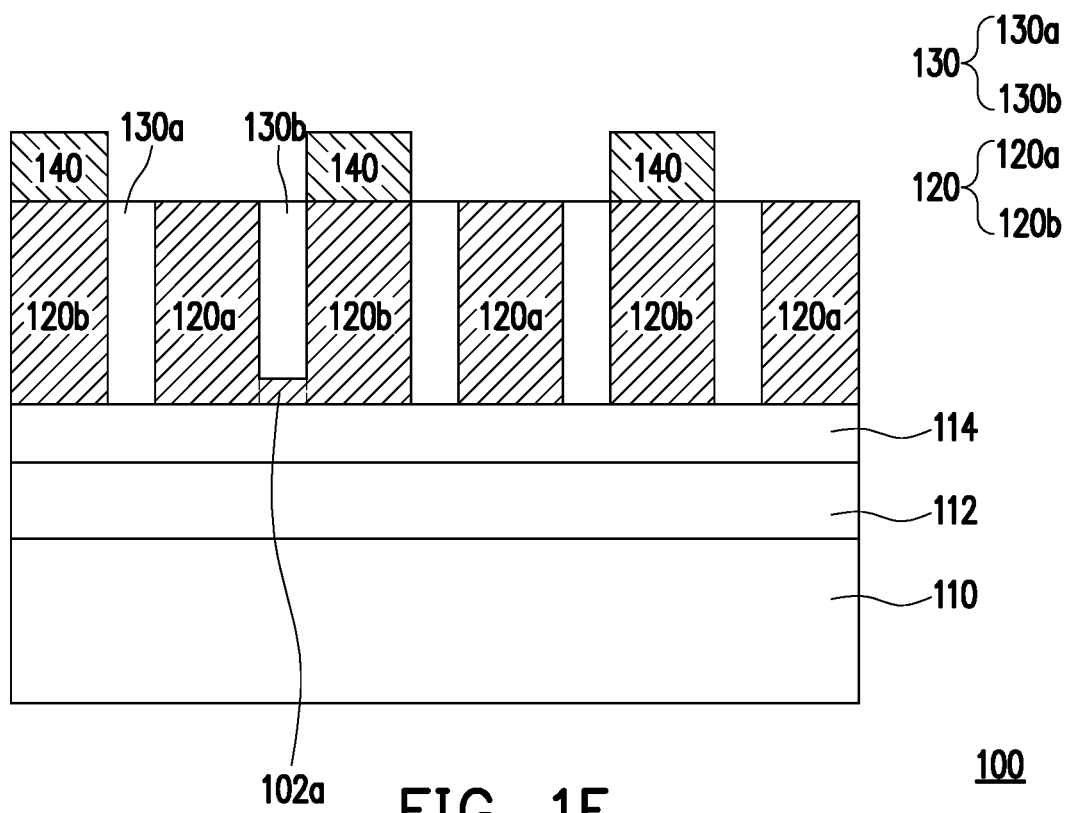

Referring to FIG. 1E, the short-circuit detection structure is formed on the substrate 110, wherein the short-circuit detection structure includes a detecting layer 140. Specifically, the detecting layer 140 is formed on one of at least two adjacent tested structures 120a and 120b. In the present embodiment, the tested structure 120b is covered by and electrically connected with the detecting layer 140. The tested structure 120a adjacent to the tested structure 120b is not covered by the detecting layer 140, such that the tested structure 120a is exposed. A material of the detecting layer 140 include, for example, a conductive material. In an embodiment, a material of the detecting layer 140 includes tungsten.

Figure 1F:
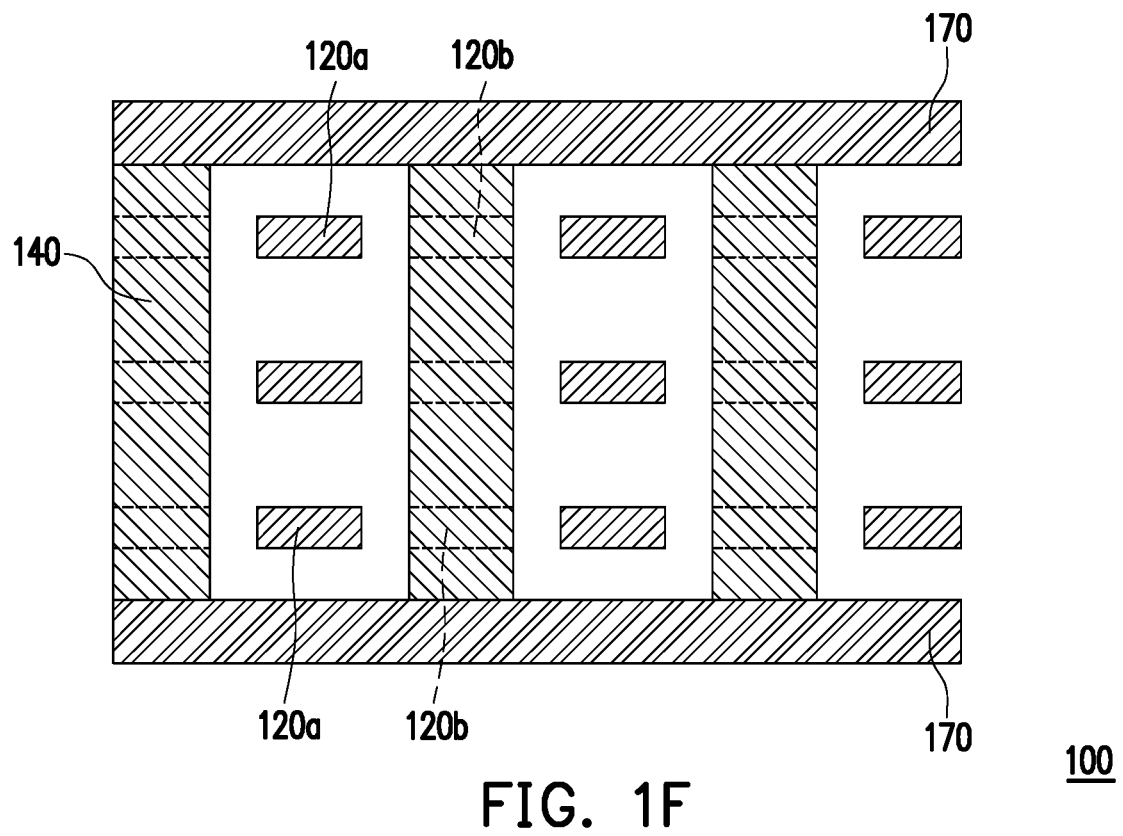
FIG. 1F is a schematic top view of a semiconductor structure according to an embodiment of the invention.

Referring to FIG. 1F, a plurality of tested structures 120 are located on the substrate 110. The tested structures 120 may be, for example, arranged in an array. The detecting layer 140 may be a strip-like structure extending along a direction and cover a corresponding tested structure 120. In some embodiments, the detecting layers 140 may be a plurality of strip-like structures, and multiple of the tested structures 120 of each column between the tested structures 120 arranged in the array are sandwiched between two adjacent ones of the detecting layers 140. In the present embodiment, the short-circuit detection structure may further include wires 170, wherein the wires 170 may be formed together in a process of forming the detecting layers 140. An extending direction of the wires 170 may be different from the extending direction of the detecting layers 140. The wires 170 are, for example, perpendicular to the detecting layers 140. In addition, the wires 170 may be electrically connected with the detecting layers 140. The detecting layers 140 and the wires 170 may be located on the same layer. In some embodiments, forming the wires 170 together in the process of forming the detecting layers 140 may further increase an area of the detecting layers 140, thereby enhancing stability in a subsequent detecting process. It should be mentioned that in FIG. 1F, two ends of each detecting layer 140 are disposed on the wires 170, but the invention is not limited thereto, and based on a process design requirement, it may be only one end disposed on the wire 170.

Thereafter, an electron beam is used for performing the detection to identify whether a short-circuit defect exists between the tested structures 120a and 120b.

The electron beam detecting process refers to scanning a surface pattern of a device passing and formed on the substrate 110 by an electron beam, and collecting secondary electrons radiating from the surface pattern of the scanned device to serve them as detection signals. The detection signals are processed and presented in a grayscale manner, thereby generating an image of the surface pattern of the scanned device. The obtained image is displayed in a grayscale contrast to show a difference in a charging voltage associated with the device, a connection state and a material. This image is a well-known voltage contrast image. A defective device or an abnormal connection may be identified by means of detecting an abnormal grayscale image or an abnormal voltage contrast image.

Figure 2A:
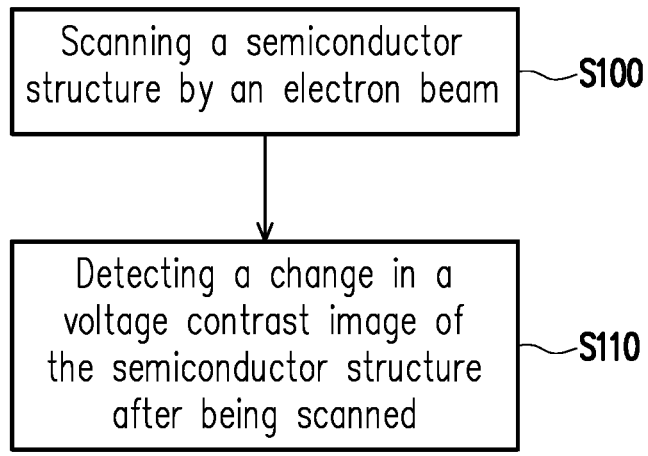
FIG. 2A is a flowchart of a method for detecting a short circuit of a semiconductor structure according to an embodiment of the invention.
Figure 2B:
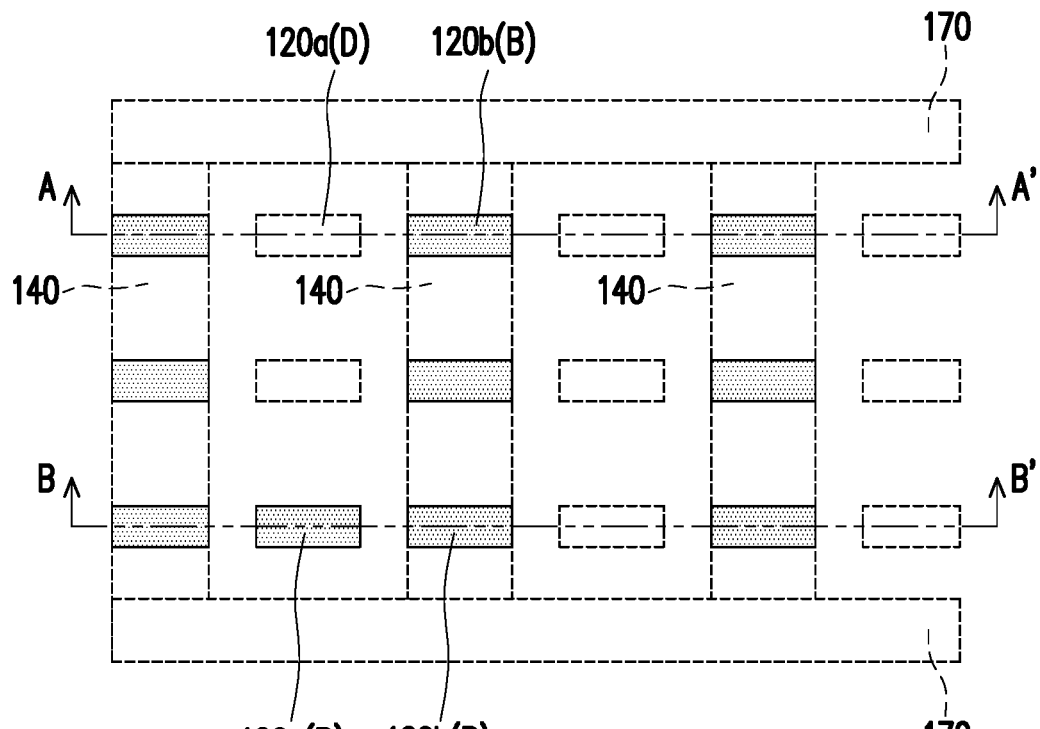
FIG. 2B is a schematic view of a voltage contrast image during an electron beam detection for a semiconductor structure depicted in the schematic top view according to an embodiment of the invention.
Figure 2C:
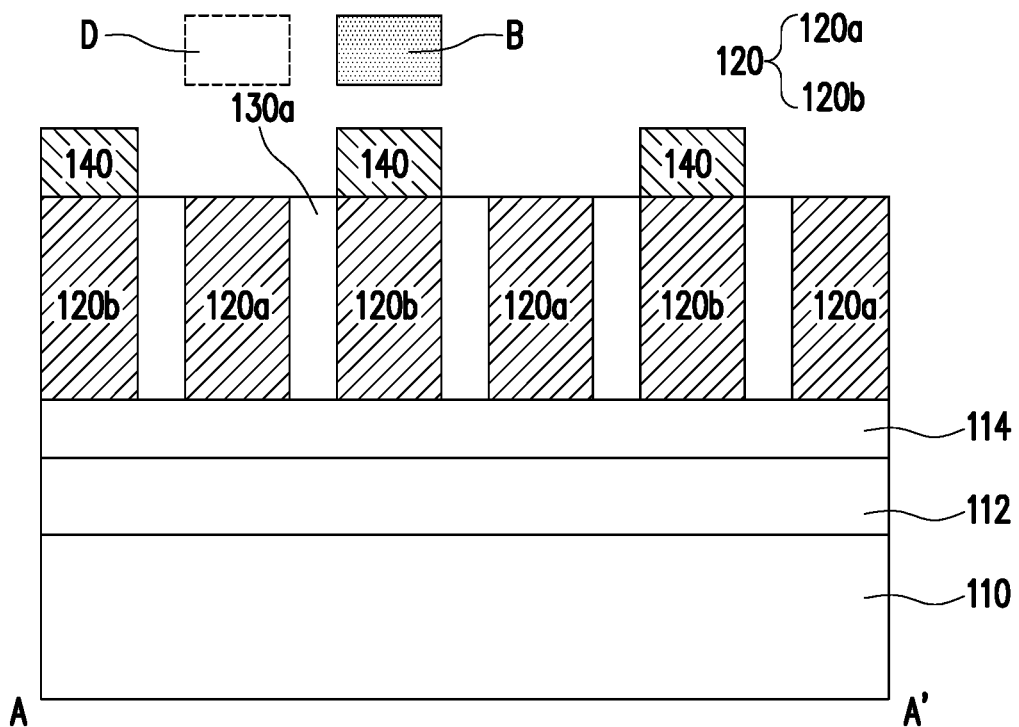
FIG. 2C is a schematic cross-sectional view of the semiconductor structure having a normal voltage contrast image during the electron beam detection along a section line A-A' in FIG. 2B according to an embodiment of the invention.
Figure 2D:
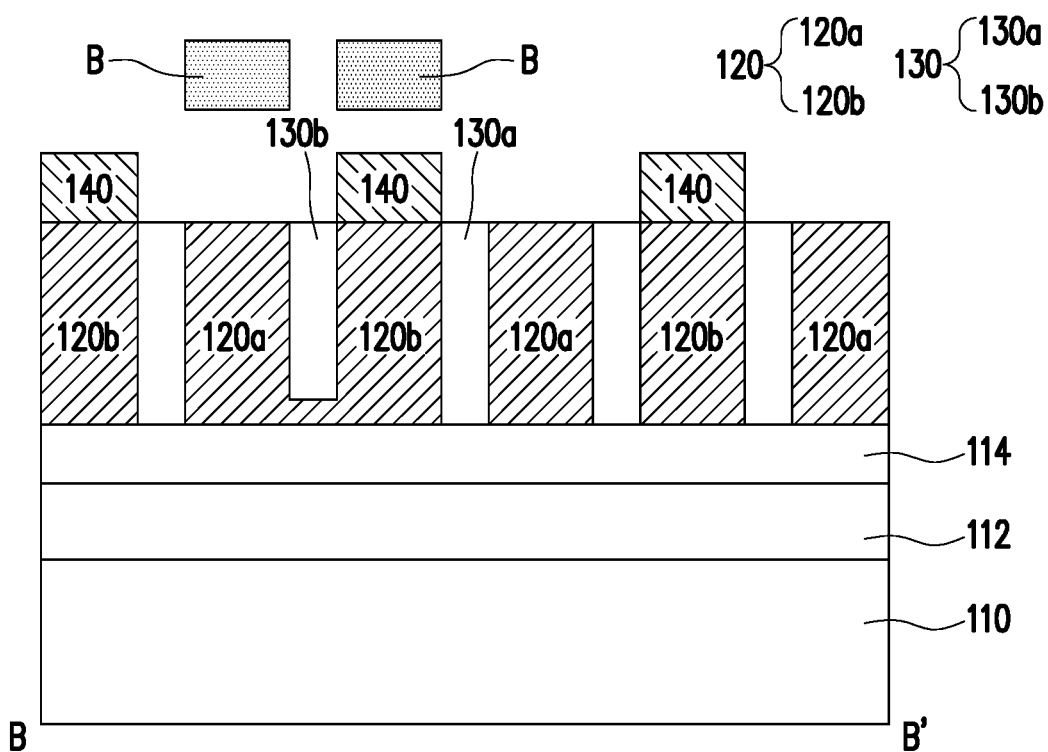
FIG. 2D is a schematic cross-sectional view of the semiconductor structure having a defective voltage contrast image during the electron beam detection along a section line B-B' in FIG. 2B according to an embodiment of the invention.

Referring to FIG. 2A through FIG. 2D simultaneously, first, step S100 is performed, where a surface of the semiconductor structure 100 is scanned by an electron beam. In this case, the surface of the semiconductor structure 100 may be composed of the surfaces of the detecting layers 140, the tested structures 120a and 120b and the dielectric layers 130. Then, step S110 is performed, where a change in a voltage contrast image of a surface 100a of the semiconductor structure 100 after being scanned is detected. When the surface of the tested structure 120b which is covered by the detecting layer 140 shows a bright spot (B), and the surface of the tested structure 120a which is not covered by the detecting layer 140 shows a dark spot (D), it indicates that the tested structures 120a and 120b are electrically insulated from each other, as illustrated in FIG. 2C. When the surface of the tested structure 120b which is covered by the detecting layer 140 and the surface of the tested structure 120a which is not covered by the detecting layer 140 both show bright spots (B), it indicates that the tested structures 120a and 120b are electrically connected with each other, i.e., a short-circuit defect exists between the tested structures 120a and 120b, as illustrated in FIG. 2D.

Because the detecting layer 140 is similar to a capacitor structure, it may keep supplying electrons to the tested structure 120b connected with the detecting layer 140. Thus, in the invention may achieve identifying whether there in any short-circuit defect existing between the at least two tested structures 120a and 120b using the electron beam detecting process through the detecting layer 140 making a more obvious difference in the change of the voltage contrast image between the at least two tested structures 120a and 120b. In detail, when the tested structures 120a and 120b are electrically insulated from each other, the surface of the tested structure 120b may receive the electrons supplied from the detecting layer 140, and thus, in the electron beam detecting process, more secondary electrons are released from the surface of the tested structure 120b than from the surface of the tested structures 120a, which causes the surface of the tested structure 120b to show the bright spot (B) and causes the surface of the tested structure 120a to show the dark spot (D). On the other hand, when the tested structures 120a and 120b are electrically connected with each other, as the electrons supplied by the detecting layer 140 may flow between the tested structures 120a and 120b, both the surfaces of the tested structures 120a and 120b show bright spots (B). Here, by the aforementioned method, the invention can overcome the issue that the electron beam detecting process fails to be used during the detection due to the equipotential phenomenon exists during the detection of the short-circuit defect.

It has to be mentioned here that the device symbols and a part of the contents of the above embodiments are used in the following embodiments, wherein the same or similar devices are presented by the same or similar symbols, the descriptions related to the same technical contents are omitted, and the descriptions related to the omitted parts may be inferred with reference to those related to the above embodiments and will not be repeated hereinafter.

Figure 3A:
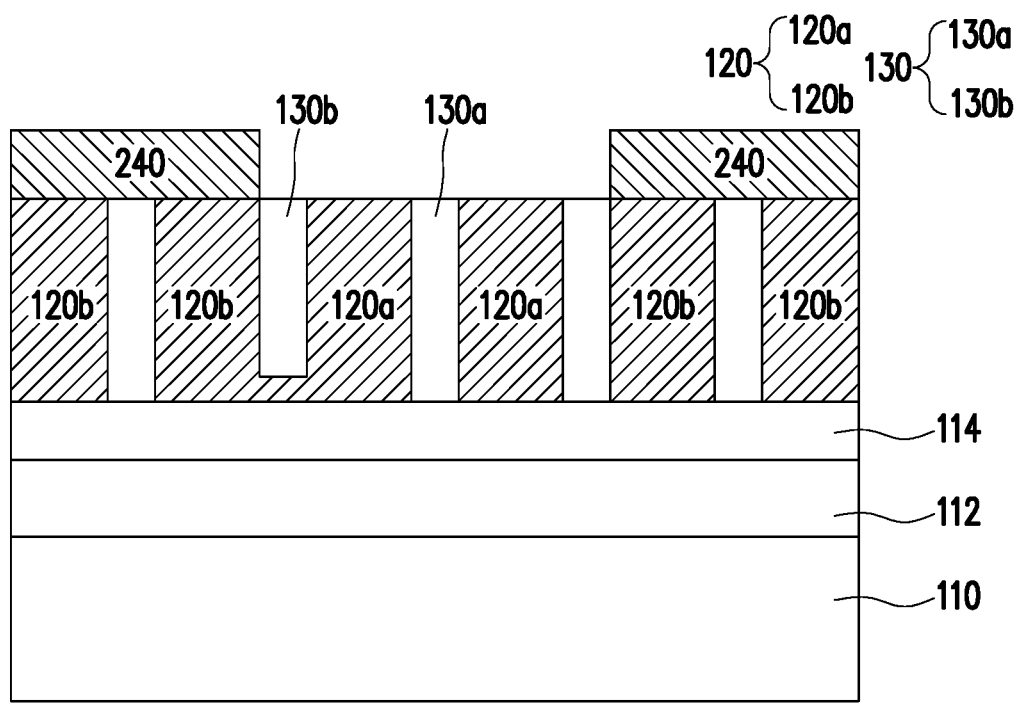
FIG. 3A is a schematic cross-sectional view of a semiconductor structure according to an embodiment of the invention.
Figure 3B:
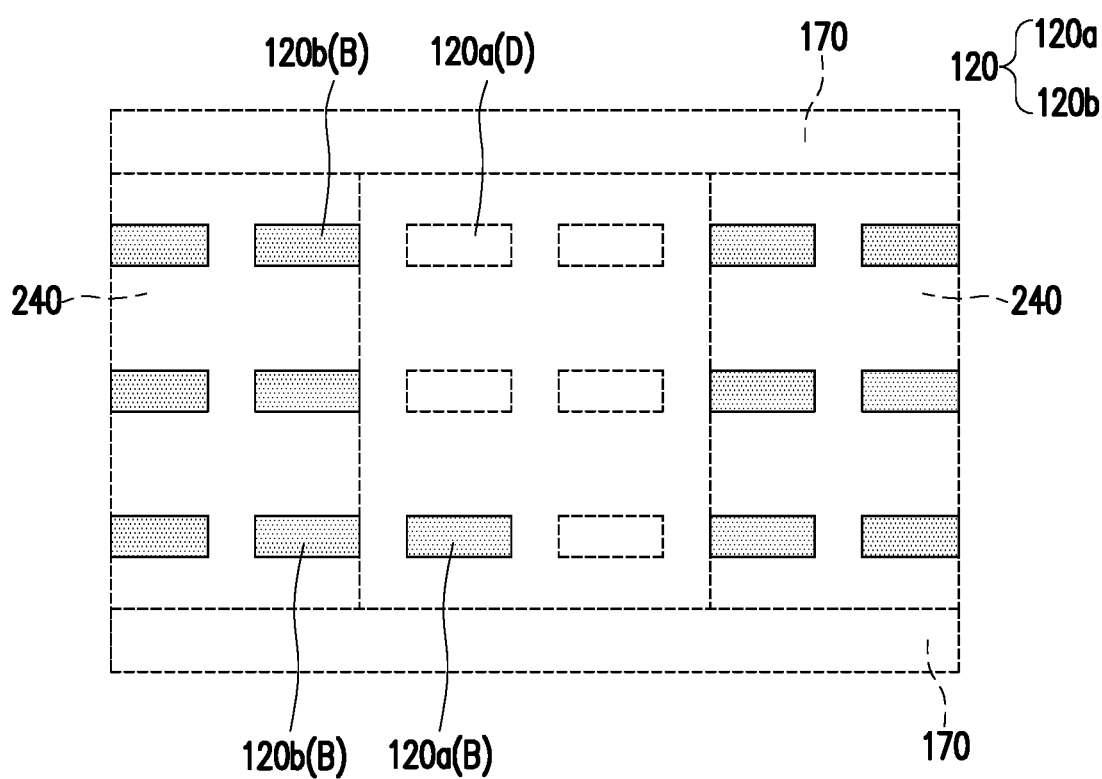
FIG. 3B is a schematic top view of a semiconductor structure according to an embodiment of the invention.

Referring to FIG. 3A and FIG. 3B simultaneously, the difference between a semiconductor structure 200 illustrated in FIG. 3A and the semiconductor structure 100 illustrated in FIG. 1E lies in that the semiconductor structure 200 may further include a tested structure set formed by at least two tested structures 120b and a tested structure 120a, and a detecting layer 240 is formed on two adjacent tested structures 120b in the tested structure set. In other words, the two adjacent tested structures 120b and the detecting layer 240 thereon are electrically connected, and the tested structure 120a is not covered by the detecting layer 240, but is exposed therefrom. In the present embodiment, as illustrated in FIG. 3B, in the electron beam detection, when surfaces of the two tested structures 120b and the tested structures 120a both show bright spots (B), it indicates that a short-circuit defect exists between the tested structure 120a and its adjacent tested structures 120b. When the surfaces of the two adjacent tested structures 120b show bright spots (B), and the surface of the tested structures 120a shows a dark spot (D), it indicates that no short-circuit defect exists between the tested structure 120a and its adjacent tested structures 120b.

Figure 4:
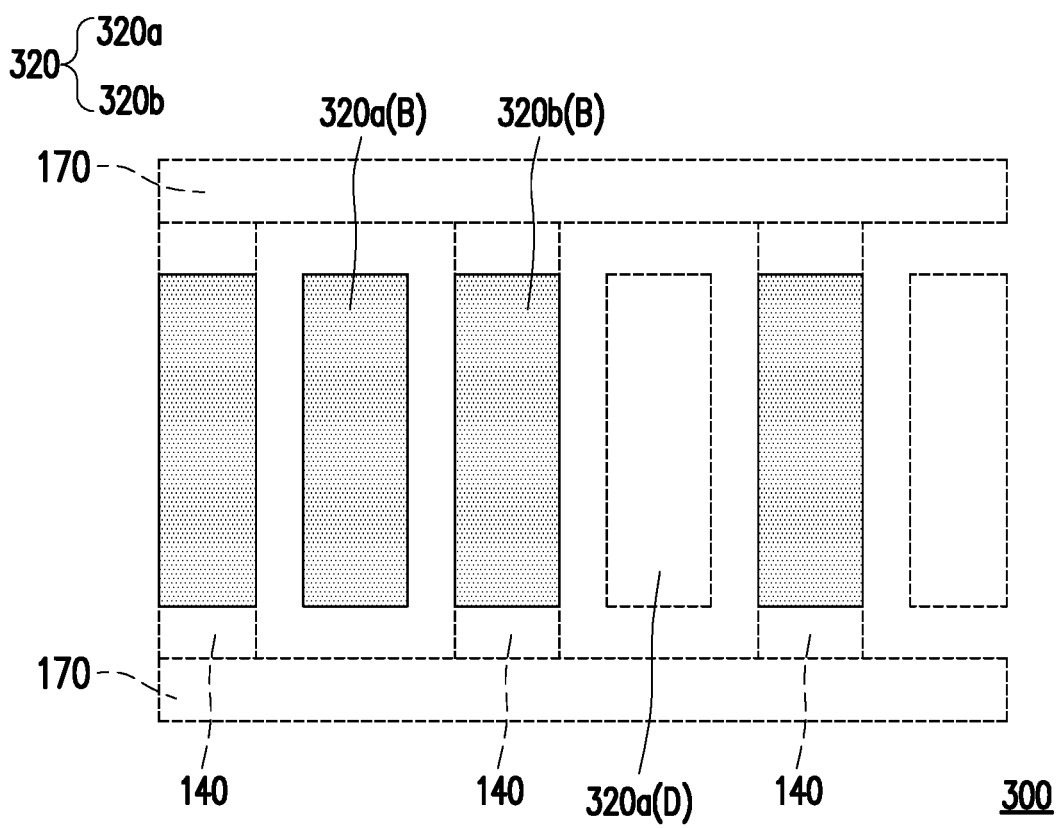
FIG. 4 is a schematic view of a voltage contrast image during an electron beam detection for the semiconductor structure depicted in the schematic top view according to an embodiment of the invention.

Referring to FIG. 4, the difference between a semiconductor structure 300 illustrated in FIG. 4 and the semiconductor structure 100 illustrated in FIG. 1F lies in that at least two tested structures 320a and 320b in the semiconductor structure 300 are growing strip-like linear structures. The tested structure 320b is covered by the detecting layer 140, and the tested structure 320a is exposed. The linear structures may be, for example, metal wires. In some embodiments, an extending direction of the metal wires is the same as the extending direction of the detecting layers 140. In the present embodiment, as illustrated in FIG. 4, during the electron beam detection, when surfaces of the tested structures 320a and 320b both show bright spots (B), it indicates that a short-circuit defect exists between the tested structures 320a and 320b. When the surface of the tested structure 320b shows a bright spot (B), and the surface of the tested structure 320a shows a dark spot (D), it indicates that no short-circuit defect exists between the tested structures 320a and 320b.

Figure 5:
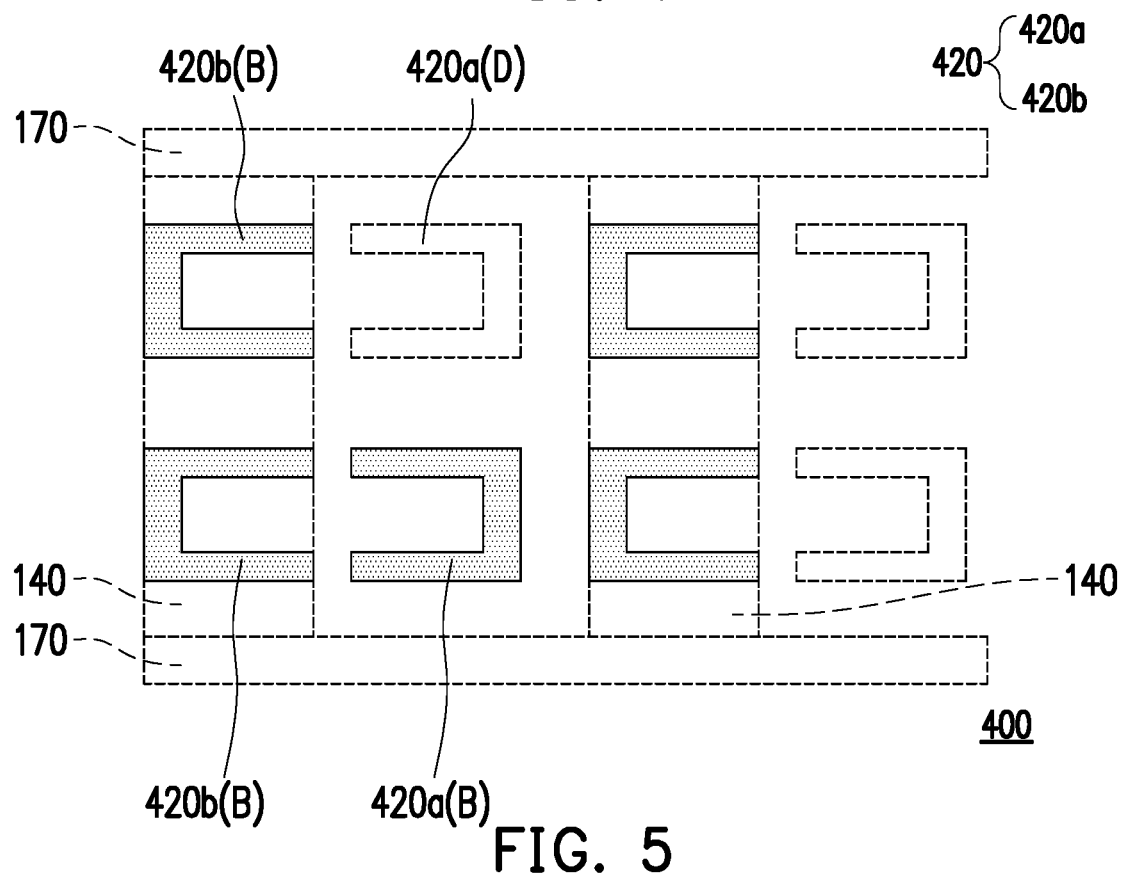
FIG. 5 is a schematic view of a voltage contrast image during an electron beam detection for the semiconductor structure depicted in the schematic top view according to an embodiment of the invention.

Referring to FIG. 5, the difference between a semiconductor structure 400 illustrated in FIG. 5 and the semiconductor structure 100 illustrated in FIG. 1F lies in that at least two tested structures 420a and 420b in the semiconductor structure 400 have special patterns. The tested structure 420b is covered by the detecting layer 140, while the tested structure 420a is exposed. Because a distance between each two adjacent patterns in a wafer is too small, it is easy to increase a difficulty of an exposure process or an etching process. Thus, a defect may be easily generated between the two adjacent patterns, and thus, the aforementioned patterns which easily generate the defects are defined as special patterns. Shapes of the special patterns are not limited in the invention, and the shapes, as long as not belonging to dotted or line-like patterns, may be referred to as the special patterns. For example, the special patterns may include an inverted-U shape, a U shape, an S shape, a W shape or a horseshoe shape. In the present embodiment, as illustrated in FIG. 5, during the electron beam detection, when surfaces of the tested structures 420a and 420b both show bright spots (B), it indicates that a short-circuit defect exists between the tested structures 420a and 420b. When the surface of the tested structure 420b shows a bright spot (B), and the surface of the tested structure 420a shows a dark spot (D), it indicates that no short-circuit defect exists between the tested structures 420a and 420b.

It should be noted that even though the at least two tested structures 120a and 120b illustrated in FIG. 1F are two contact windows, the at least two tested structures 320a and 320b illustrated in FIG. 4 are metal wires, and the at least two tested structures 420a and 420b illustrated in FIG. 5 are two special patterns, the invention is not limited thereto, and the aspects of the tested structures described above may be respectively combined in two for detection, for example, one of the at least two tested structures may be a contact window, and the other one may be a metal wire.

In view of the foregoing, in the invention, the detecting layer is formed on one of the at least two tested structures, so as to overcome the issue that the electron beam cannot be used for the detection in the detecting process due to the equipotential phenomenon existing when the short-circuit defect is detected.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A semiconductor structure configured to generate a voltage contrast image, comprising:
   a substrate;
   at least two tested structures, disposed on the substrate, wherein a material of the at least two tested structures comprises a conductive material;
   an isolation structure, sandwiched between the at least two tested structures; and
   a short-circuit detection structure, comprising a detecting layer only disposed on an upper surface of one of the at least two tested structures, wherein the short-circuit detection structure is electrically connected to the one of the at least two tested structures, another one of the at least two tested structures is exposed, and a material of the detecting layer comprises a conductive material.

2. The semiconductor structure according to claim 1, wherein the at least two tested structures comprise contact windows, metal wires, special patterns or a combination thereof.

3. The semiconductor structure according to claim 1, wherein the semiconductor structure is located on a scribe line.

4. The semiconductor structure according to claim 1, wherein the short-circuit detection structure further comprises a wire, the wire is perpendicular to the detecting layer, and the wire and the detecting layer are electrically connected with each other.

5. The semiconductor structure according to claim 1, wherein the at least two tested structures are arranged in an array, and the tested structures of each column of the array are sandwiched between adjacent two of a plurality of the detecting layers.

6. A manufacturing method of a semiconductor structure, comprising:
   providing a substrate;
   forming at least two tested structures on the substrate;
   forming an isolation structure between the at least two tested structures; and
   forming a short-circuit detection structure on the at least two tested structures, wherein a step of forming the short-circuit detection structure comprises only forming a detecting layer on an upper surface of one of the at least two tested structures, and the short-circuit detection structure is electrically connected to the one of the at least two tested structures, another one of the at least two tested structures is exposed.

7. The manufacturing method of the semiconductor structure according to claim 6, wherein a method of forming the at least two tested structures comprises:
   forming a conductive material layer on the substrate; and
   forming a plurality of openings in the conductive material layer, wherein the tested structures are isolated by the openings.

8. The manufacturing method of the semiconductor structure according to claim 7, wherein a method of forming the isolation structure comprises filling a dielectric material in the openings.

9. A method for detecting a short circuit using the semiconductor structure according to claim 1, comprising:
   scanning the short-circuit detection structure by an electron beam; and
   detecting a change of a voltage contrast image of the short-circuit detection structure after being scanned, wherein
when the upper surface of one of the at least two tested structures which is covered by the detecting layer shows a bright spot, and a surface of the another one of the at least two tested structures which is exposed by the detecting layer shows a dark spot, it indicates that the at least two tested structures are electrically insulated from each other; and
when the upper surface of one of the at least two tested structures which is covered by the detecting layer and the surface of the another one of the at least two tested structures which is exposed by the detecting layer both show bright spots, it indicates that the at least two tested structures are electrically connected with each other.

10. A method for detecting a short circuit using the semiconductor structure according to claim 2, comprising:
scanning the short-circuit detection structure by an electron beam; and
detecting a change of a voltage contrast image of the short-circuit detection structure after being scanned,
wherein
when the upper surface of one of the at least two tested structures which is covered by the detecting layer shows a bright spot, and a surface of the another one of the at least two tested structures which is exposed by the detecting layer shows a dark spot, it indicates that the at least two tested structures are electrically insulated from each other; and
when the upper surface of one of the at least two tested structures which is covered by the detecting layer and the surface of the another one of the at least two tested structures which is exposed by the detecting layer both show bright spots, it indicates that the at least two tested structures are electrically connected with each other.

11. A method for detecting a short circuit using the semiconductor structure according to claim 3, comprising:
scanning the short-circuit detection structure by an electron beam; and
detecting a change of a voltage contrast image of the short-circuit detection structure after being scanned,
wherein
when the upper surface of one of the at least two tested structures which is covered by the detecting layer shows a bright spot, and a surface of the another one of the at least two tested structures which is exposed by the detecting layer shows a dark spot, it indicates that the at least two tested structures are electrically insulated from each other; and
when the upper surface of one of the at least two tested structures which is covered by the detecting layer and the surface of the another one of the at least two tested structures which is exposed by the detecting layer both show bright spots, it indicates that the at least two tested structures are electrically connected with each other.

12. A method for detecting a short circuit using the semiconductor structure according to claim 4, comprising:
scanning the short-circuit detection structure by an electron beam; and
detecting a change of a voltage contrast image of the short-circuit detection structure after being scanned,
wherein
when the upper surface of one of the at least two tested structures which is covered by the detecting layer shows a bright spot, and a surface of the another one of the at least two tested structures which is exposed by the detecting layer shows a dark spot, it indicates that the at least two tested structures are electrically insulated from each other; and
when the upper surface of one of the at least two tested structures which is covered by the detecting layer and the surface of the another one of the at least two tested structures which is exposed by the detecting layer both show bright spots, it indicates that the at least two tested structures are electrically connected with each other.

13. A method for detecting a short circuit using the semiconductor structure according to claim 5, comprising:
scanning the short-circuit detection structure by an electron beam; and
detecting a change of a voltage contrast image of the short-circuit detection structure after being scanned,
wherein
when the upper surface of one of the at least two tested structures which is covered by the detecting layer shows a bright spot, and a surface of the another one of the at least two tested structures which is exposed by the detecting layer shows a dark spot, it indicates that the at least two tested structures are electrically insulated from each other; and
when the upper surface of one of the at least two tested structures which is covered by the detecting layer and the surface of the another one of the at least two tested structures which is exposed by the detecting layer both show bright spots, it indicates that the at least two tested structures are electrically connected with each other.

* * * * *